United States Patent
Lee et al.

(10) Patent No.: US 11,568,946 B2
(45) Date of Patent: Jan. 31, 2023

(54) MEMORY DEVICE PERFORMING VERIFY OPERATION AND METHOD OF OPERATING THE SAME

(71) Applicant: SK hynix Inc., Gyeonggi-do (KR)

(72) Inventors: Jong Hoon Lee, Gyeonggi-do (KR); Se Chun Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/354,169

(22) Filed: Jun. 22, 2021

(65) Prior Publication Data

US 2022/0189567 A1    Jun. 16, 2022

(30) Foreign Application Priority Data

Dec. 10, 2020    (KR) .......................... 10-2020-0172420

(51) Int. Cl.
```
G11C 16/04      (2006.01)
G11C 16/34      (2006.01)
G11C 11/56      (2006.01)
G11C 16/10      (2006.01)
```
(52) U.S. Cl.
CPC ...... G11C 16/3459 (2013.01); G11C 11/5628 (2013.01); G11C 11/5671 (2013.01); G11C 16/0483 (2013.01); G11C 16/10 (2013.01)

(58) Field of Classification Search
CPC ............ G11C 16/3459; G11C 11/5628; G11C 11/5671; G11C 16/0483; G11C 16/10; G11C 16/32; G11C 16/3404

USPC ..................................................... 365/185.03
See application file for complete search history.

(56) References Cited

U.S. PATENT DOCUMENTS

| 8,675,416 | B2 * | 3/2014 | Lee .................... G11C 16/3459 365/185.22 |
| 9,275,751 | B2 * | 3/2016 | Hahn ................. G11C 16/3459 |
| 9,691,486 | B2 * | 6/2017 | Kim ....................... G11C 16/12 |
| 9,859,015 | B2 * | 1/2018 | Kim ....................... G11C 16/10 |

FOREIGN PATENT DOCUMENTS

| KR | 10-2011-0028937 A | 3/2011 |
| KR | 10-2018-0062158 A | 6/2018 |

* cited by examiner

*Primary Examiner* — Tha-O H Bui
(74) *Attorney, Agent, or Firm* — IP & T Group LLP

(57) ABSTRACT

The memory device may include a plurality of memory cells, a peripheral circuit, and a control logic. The peripheral circuit may perform a program operation on the plurality of memory cells and may perform program verify operations each including at least one verify loop corresponding to a plurality of program states programmed in the program operation. The control logic may control the peripheral circuit to perform a verify pulse apply operation and an additional verify pulse apply operation when a target verify loop count exceeds a reference count corresponding to the target program state, and may determine a failure of the program verify operation corresponding to the target program state based on results of the verify pulse apply operation and the additional verify pulse apply operation. A verify voltage of the additional verify pulse apply operation is higher than a verify voltage of the verify pulse apply operation.

20 Claims, 11 Drawing Sheets

| State | Program Verify Loop Max |
|---|---|
| P1 | PV1_LM |
| P2 | PV2_LM |
| ⋮ | ⋮ |
| P7 | PV7_LM |

MEMORY DEVICE PERFORMING VERIFY OPERATION AND METHOD OF OPERATING THE SAME

CROSS-REFERENCE TO RELATED APPLICATION

The present application claims priority under 35 U.S.C. § 119(a) to Korean patent application number 10-2020-0172420 filed on Dec. 10, 2020, which is incorporated herein by reference in its entirety.

BACKGROUND

Field of Invention

The present disclosure relates to an electronic device, and more particularly, to a memory device and a method of operating the same.

Description of Related Art

A storage device is a device that stores data under control of a host device such as a computer or a smartphone. A storage device may include a memory device in which data is stored and a memory controller controlling the memory device. The memory device is divided into a volatile memory device and a nonvolatile memory device.

The volatile memory device is a device that stores data only when power is supplied and loses the stored data when the power supply is cut off. The volatile memory device includes a static random access memory (SRAM), a dynamic random access memory (DRAM), and the like.

The nonvolatile memory device is a device that does not lose data even though power is cut off. The nonvolatile memory device includes a read only memory (ROM), a programmable ROM (PROM), an electrically programmable ROM (EPROM), an electrically erasable and programmable ROM (EEPROM), a flash memory, and the like.

SUMMARY

An embodiment of the present disclosure provides a memory device having improved program verify performance and a method of operating the same.

According to an embodiment of the present disclosure, a memory device may include a plurality of memory cells, a peripheral circuit, and a control logic. The peripheral circuit may perform a program operation on the plurality of memory cells and may perform program verify operations each including at least one verify loop corresponding to a plurality of program states programmed in the program operation. The control logic may control the peripheral circuit to perform a verify pulse apply operation and an additional verify pulse apply operation when a target verify loop count, which is a number of verify loops performed in the program verify operation corresponding to a target program state among the plurality of program states, exceeds a reference count corresponding to the target program state, and may determine whether the program verify operation corresponding to the target program state is failed based on results of the verify pulse apply operation and the additional verify pulse apply operation. A verify voltage higher than a verify voltage of the verify pulse apply operation is applied to the memory cells in the additional verify pulse apply operation.

According to an embodiment of the present disclosure, a method of operating a memory device may include performing a program operation on a plurality of memory cells; and performing program verify operations each including at least one verify loop corresponding to a plurality of program states programmed in the program operation. Performing a program verify operation corresponding to a target program state among the plurality of program states comprises performing a verify pulse apply operation; and performing an additional verify pulse apply operation in which a verify voltage higher than a verify voltage of the verify pulse apply operation is applied to the memory cells, when a target verify loop count, which is a number of verify loops performed in the program verify operation corresponding to the target program state, exceeds a reference count corresponding to the target program state.

According to an embodiment of the present disclosure, a method of operating a memory device may include performing a predetermined number of program loops on memory cells; and performing, when the memory cells are not programmed to a target program state despite the predetermined number of program loops, one or more additional program loops on the memory cells. Each of the program loops includes a program voltage apply step and a program verify step. The program verify step is performed, during the predetermined number of program loops, based on first comparison between a reference and a number of memory cells having threshold voltages lower than a lower verify voltage among the memory cells. The program verify step is performed, during the additional program loops, based on the first comparison and a second comparison between the reference and a number of memory cells having threshold voltages higher than a higher verify voltage among the memory cells, and wherein failure of programming the memory cells to the target program state depends on the second comparison.

According to the present technology, a memory device having improved program verify performance and a method of operating the same are provided.

DETAILED DESCRIPTION

Specific structural or functional descriptions of embodiments according to the concept which are disclosed in the present specification are illustrated only to describe the embodiments according to the concept of the present disclosure.

The embodiments according to the concept of the present disclosure may be carried out in various forms and the descriptions are not limited to the embodiments described in the present specification.

Figure 1:
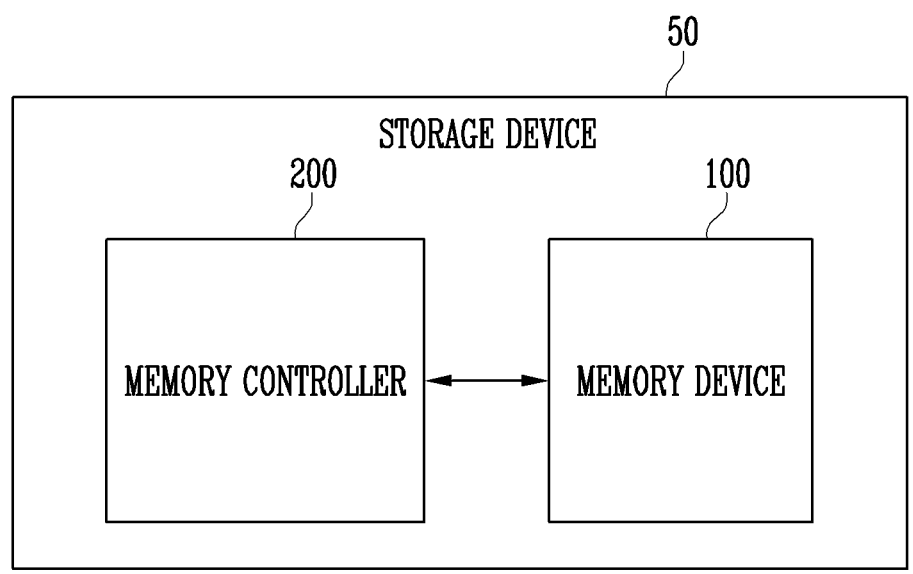
FIG. 1 is a diagram illustrating a storage device according to an embodiment of the present disclosure.

FIG. 1 is a diagram illustrating a storage device according to an embodiment of the present disclosure.

Referring to FIG. 1, the storage device 50 may include a memory device 100 and a memory controller 200 that controls an operation of the memory device. The storage device 50 is a device that stores data under control of a host such as a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface that is a communication method with the host. For example, the storage device 50 may be configured as any of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any of various types of packages. For example, the storage device 50 may be manufactured as any of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates under control of the memory controller 200. The memory device 100 may include a memory cell array including a plurality of memory cells that store the data.

Each of the memory cells may be configured as a single level cell (SLC) storing one data bit, a multi-level cell (MLC) storing two data bits, a triple level cell (TLC) storing three data bits, or a quad level cell (QLC) storing four data bits.

The memory cell array may include a plurality of memory blocks. Each memory block may include the plurality of memory cells. One memory block may include a plurality of pages. In an embodiment, the page may be a unit for storing data in the memory device 100 or reading data stored in the memory device 100.

The memory block may be a unit for erasing data. In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), a spin transfer torque random access memory (STT-RAM), or the like. In the present specification, for convenience of description, the memory device 100 is a NAND flash memory.

The memory device 100 is configured to receive a command and an address from the memory controller 200 and access an area selected by the address of the memory cell array. That is, the memory device 100 may perform an operation instructed by the command on the area selected by the address. For example, the memory device 100 may perform a write operation (program operation), a read operation, and an erase operation. During the program operation, the memory device 100 may program data to the area selected by the address. During the read operation, the memory device 100 may read data from the area selected by the address. During the erase operation, the memory device 100 may erase data stored in the area selected by the address.

In an embodiment, the memory device 100 may perform a program operation of programming the plurality of memory cells to a corresponding program state among a plurality of program states. The memory device 100 may perform program verify operations respectively corresponding to the plurality of program states.

The memory device 100 may determine whether the program operation is failed, based on results of the program verify operations respectively corresponding to the plurality of program states. When all of the program verify operations respectively corresponding to the plurality of program states are passed, the memory device 100 may determine that the program operation is passed. When at least one of the program verify operations respectively corresponding to the plurality of program states is failed, the memory device 100 may determine that the program operation is failed.

In an embodiment, each of the program verify operations may include at least one verify loop. In the at least one verify loop, the memory device 100 may perform at least one of a verify pulse apply operation of applying a verify voltage to a word line connected to the plurality of memory cells and an additional verify pulse apply operation of applying an additional verify voltage to the word line.

In an embodiment, when a target verify loop count is less than or equal to a reference count corresponding to a target program state, the memory device 100 may perform the verify pulse apply operation in the verify loop. The target verify loop count may be the number of verify loops performed in the program verify operation corresponding to the target program state. The reference count may be a maximum number of the verify loops to be performed in the program verify operation. When the target verify loop count is greater than the reference count corresponding to the target program state, the memory device 100 may perform the verify pulse apply operation and the additional verify pulse apply operation in the verify loop.

In an embodiment, the verify voltage applied in the additional verify pulse apply operation may be higher than the verify voltage applied in the verify pulse apply operation. For example, the verify voltage applied in the verify pulse apply operation may be a minimum voltage of a threshold voltage distribution corresponding to the target program state. The verify voltage applied in the additional verify pulse apply operation may be a maximum voltage of the threshold voltage distribution corresponding to the target program state.

The memory device 100 may determine whether the program verify operation corresponding to the target program state is failed, based on results of the verify pulse apply operation and the additional verify pulse apply operation. When the verify pulse apply operation or the additional verify pulse apply operation is failed, the memory device 100 may determine that the program verify operation corresponding to the target program state is failed. When both of the verify pulse apply operation and the additional verify pulse apply operation are passed, the memory device 100 may determine that the program verify operation corresponding to the target program state is passed.

The memory device 100 may determine whether the verify pulse apply operation is failed, based on a result of comparing the number of memory cells having a threshold voltage lower than the verify voltage applied in the verify pulse apply operation among the memory cells programmed to the target program state with a reference permission bit number. The reference permission bit number may be a maximum bit number at which error correction is possible.

The memory device 100 may determine whether the additional verify pulse apply operation is failed, based on a result of comparing the number of memory cells having a threshold voltage higher than the verify voltage applied in the additional verify pulse apply operation among the memory cells programmed to the target program state with the reference permission bit number.

The memory controller 200 controls an overall operation of the storage device 50.

When power is applied to the storage device 50, the memory controller 200 may execute firmware FW. When the memory device 100 is a flash memory device, the memory controller 200 may operate firmware such as a flash translation layer (FTL) for controlling communication between the host and the memory device 100.

In an embodiment, the memory controller 200 may receive data and a logical block address (LBA) from the host and convert the LBA into a physical block address (PBA) indicating an address of memory cells in which data included in the memory device 100 is to be stored.

The memory controller 200 may control the memory device 100 to perform the program operation, the read operation, or the erase operation in response to a request from the host. During the program operation, the memory controller 200 may provide a write command, the PBA, and the data to the memory device 100. During the read operation, the memory controller 200 may provide a read command and the PBA to the memory device 100. During the erase operation, the memory controller 200 may provide an erase command and the PBA to the memory device 100.

In an embodiment, the memory controller 200 may generate and transmit the command, the address, and the data to the memory device 100 regardless of the request from the host. For example, the memory controller 200 may provide the command, the address, and the data to the memory device 100 to perform background operations such as a program operation for wear leveling and a program operation for garbage collection.

In an embodiment, the memory controller 200 may control at least two memory devices 100. In this case, the memory controller 200 may control the memory devices 100 according to an interleaving method to improve operation performance. The interleaving method may be an operation method for overlapping operation periods of at least two memory devices 100.

The host may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

Figure 2:
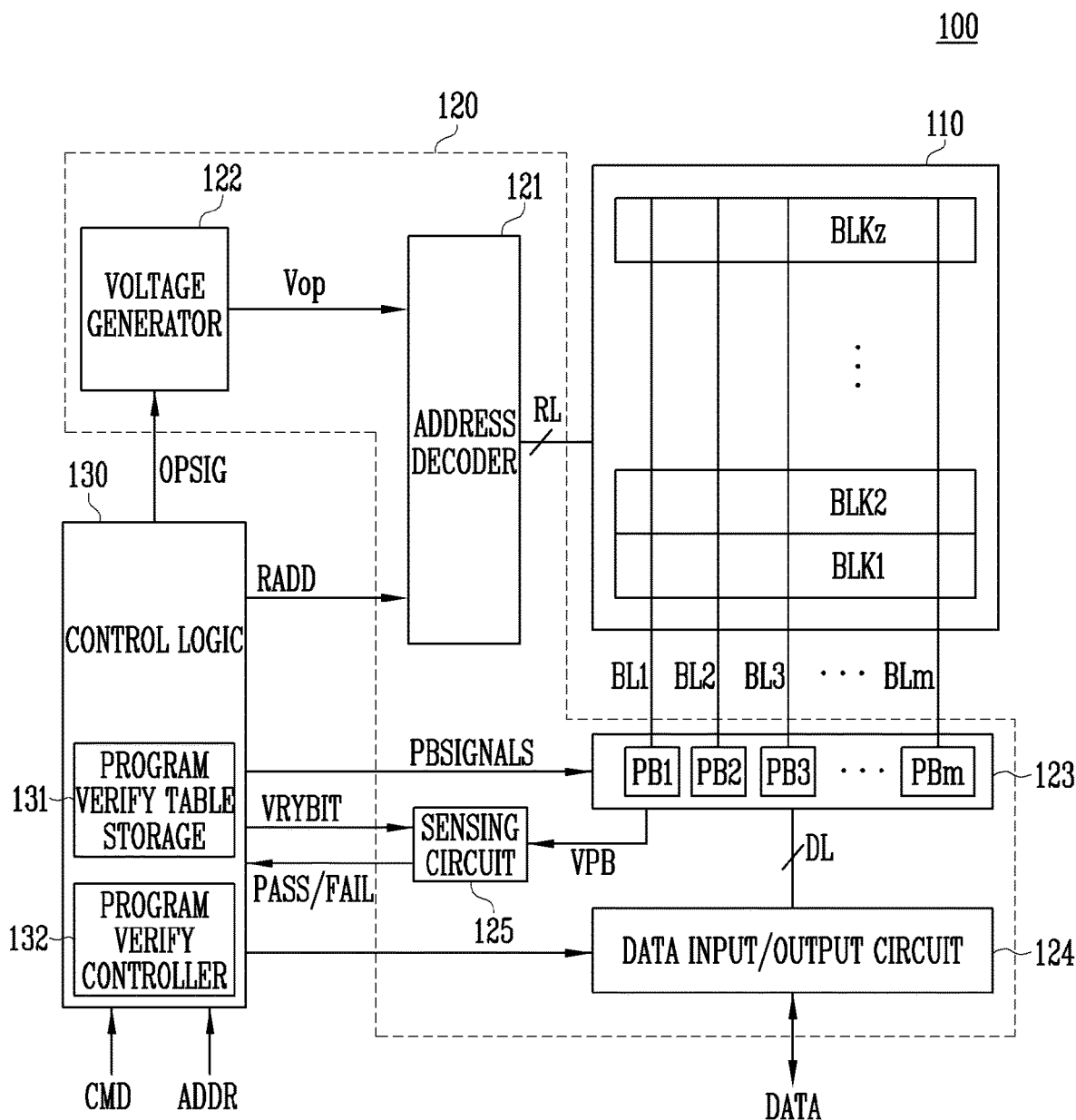
FIG. 2 is a diagram illustrating a structure of a memory device of FIG. 1, according to an embodiment of the present disclosure.

FIG. 2 is a diagram illustrating a structure of the memory device of FIG. 1, according to an embodiment of the present disclosure.

Referring to FIG. 2, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are connected to an address decoder 121 through row lines RL. The plurality of memory blocks BLK1 to BLKz are connected to a read and write circuit 123 through bit lines BL1 to BLm. Each of the plurality of memory blocks BLK1 to BLKz includes a plurality of memory cells. In an embodiment, the plurality of memory cells are nonvolatile memory cells. Memory cells connected to the same word line among the plurality of memory cells are defined as one physical page. That is, the memory cell array 110 is configured of a plurality of physical pages. According to an embodiment of the present disclosure, each of the plurality of memory blocks BLK1 to BLKz included in the memory cell array 110 may include a plurality of dummy cells. At least one of the dummy cells may be connected in series between a drain select transistor and the memory cells, and between a source select transistor and the memory cells.

Each of the memory cells of the memory device 100 may be configured as an SLC that stores one data bit, an MLC that stores two data bits, a TLC that stores three data bits, or a QLC that stores four data bits.

The peripheral circuit 120 may include the address decoder 121, a voltage generator 122, the read and write circuit 123, a data input/output circuit 124, and a sensing circuit 125.

The peripheral circuit 120 drives the memory cell array 110. For example, the peripheral circuit 120 may drive the memory cell array 110 to perform a program operation, a read operation, and an erase operation.

The address decoder 121 is connected to the memory cell array 110 through the row lines RL. The row lines RL may include drain select lines, word lines, source select lines, and a common source line. According to an embodiment of the present disclosure, the word lines may include normal word lines and dummy word lines. According to an embodiment of the present disclosure, the row lines RL may further include a pipe select line.

The address decoder 121 is configured to operate in response to control of the control logic 130. The address decoder 121 receives an address ADDR from the control logic 130.

The address decoder 121 is configured to decode a block address of the received address ADDR. The address decoder 121 selects at least one memory block among the memory blocks BLK1 to BLKz according to the decoded block address. The address decoder 121 is configured to decode a row address of the received address ADDR. The address decoder 121 may select at least one word line among word lines of the selected memory block according to the decoded row address. The address decoder 121 may apply an operation voltage Vop supplied from the voltage generator 122 to the selected word line.

During the program operation, the address decoder 121 may apply a program voltage to a selected word line and apply a pass voltage having a level less than that of the program voltage to unselected word lines. During a program verify operation, the address decoder 121 may apply a verify voltage to the selected word line and apply a verify pass voltage having a level greater than that of the verify voltage to the unselected word lines.

During the read operation, the address decoder 121 may apply a read voltage to the selected word line and apply a read pass voltage having a level greater than that of the read voltage to the unselected word lines.

According to an embodiment of the present disclosure, the erase operation of the memory device 100 is performed in memory block units. The address ADDR input to the memory device 100 during the erase operation includes a block address. The address decoder 121 may decode the block address and select at least one memory block according to the decoded block address. During the erase operation, the address decoder 121 may apply a ground voltage to the word lines input to the selected memory block.

According to an embodiment of the present disclosure, the address decoder 121 may be configured to decode a column address of the transferred address ADDR. The decoded column address may be transferred to the read and write circuit 123. As an example, the address decoder 121 may include a component such as a row decoder, a column decoder, and an address buffer.

The voltage generator 122 is configured to generate a plurality of operation voltages Vop by using an external power voltage supplied to the memory device 100. The voltage generator 122 operates in response to the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate the plurality of operation voltages Vop using the external power voltage or the internal power voltage. The voltage generator 122 may be configured to generate various voltages required by the memory device 100. For example, the voltage generator 122 may generate a plurality of erase voltages, a plurality of program voltages, a plurality of pass voltages, a plurality of selection read voltages, and a plurality of non-selection read voltages.

In order to generate the plurality of operation voltages Vop having various voltage levels, the voltage generator 122 may include a plurality of pumping capacitors that receive the internal voltage and selectively activate the plurality of pumping capacitors in response to the control logic 130 to generate the plurality of operation voltages Vop.

The plurality of generated operation voltages Vop may be supplied to the memory cell array 110 by the address decoder 121.

The read and write circuit 123 includes first to m-th page buffers PB1 to PBm. The first to m-th page buffers PB1 to PBm are connected to the memory cell array 110 through first to m-th bit lines BL1 to BLm, respectively. The first to m-th page buffers PB1 to PBm operate in response to the control of the control logic 130.

The first to m-th page buffers PB1 to PBm communicate data DATA with the data input/output circuit 124. At a time of program, the first to m-th page buffers PB1 to PBm receive the data DATA to be stored through the data input/output circuit 124 and data lines DL.

During the program operation, when a program voltage is applied to the selected word line, the first to m-th page buffers PB1 to PBm may transfer the data DATA to be stored, that is, the data DATA received through the data input/output circuit 124 to the selected memory cells through the bit lines BL1 to BLm. The memory cells of the selected page are programmed according to the transferred data DATA. A memory cell connected to a bit line to which a program permission voltage (for example, a ground voltage) is applied may have an increased threshold voltage. A threshold voltage of a memory cell connected to a bit line to which a program inhibition voltage (for example, a power voltage) is applied may be maintained. During the program verify operation, the first to m-th page buffers PB1 to PBm read the data DATA stored in the memory cells from the selected memory cells through the bit lines BL1 to BLm.

During the read operation, the read and write circuit 123 may read the data DATA from the memory cells of the selected page through the bit lines BL1 to BLm and store the read data DATA in the first to m-th page buffers PB1 to PBm.

During the erase operation, the read and write circuit 123 may float the bit lines BL1 to BLm. In an embodiment, the read and write circuit 123 may include a column selection circuit.

The data input/output circuit 124 is connected to the first to m-th page buffers PB1 to PBm through the data lines DL. The data input/output circuit 124 operates in response to the control of the control logic 130.

The data input/output circuit 124 may include a plurality of input/output buffers (not shown) that receive input data DATA. During the program operation, the data input/output circuit 124 receives the data DATA to be stored from an external controller (not shown). During the read operation, the data input/output circuit 124 outputs normal data DATA transferred from the first to m-th page buffers PB1 to PBm included in the read and write circuit 123 to the external controller.

During the read operation or the verify operation, the sensing circuit 125 may generate a reference current in response to a signal of a permission bit VRYBIT generated by the control logic 130 and may compare a sensing voltage VPB received from the read and write circuit 123 with a reference voltage generated by the reference current to output a pass signal or a fail signal to the control logic 130.

The control logic 130 may be connected to the address decoder 121, the voltage generator 122, the read and write circuit 123, the data input/output circuit 124, and the sensing circuit 125. The control logic 130 may be configured to control all operations of the memory device 100. The control logic 130 may operate in response to a command CMD transferred from an external device.

The control logic 130 may generate various signals in response to the command CMD and the address ADDR to control the peripheral circuit 120. For example, the control logic 130 may generate an operation signal OPSIG, the address ADDR, a read and write circuit control signal PBSIGNALS, and the permission bit VRYBIT in response to the command CMD and the address ADDR. The control logic 130 may output the operation signal OPSIG to the voltage generator 122, output the address ADDR to the address decoder 121, output the read and write control signal to the read and write circuit 123, and output the permission bit VRYBIT to the sensing circuit 125. In addition, the control logic 130 may determine whether the verify operation is passed or failed in response to the pass or fail signal PASS/FAIL output by the sensing circuit 125.

In an embodiment, the control logic 130 may control the peripheral circuit 120 to perform the program operation of programming the plurality of memory cells to a corresponding program state among the plurality of program states. The control logic 130 may control the peripheral circuit 120 to perform the program verify operations respectively corresponding to the plurality of program states.

In an embodiment, each of the program verify operations may include at least one verify loop. In the at least one verify loop, at least one of the verify pulse apply operation of applying the verify voltage to the word line connected to the plurality of memory cells and the additional verify pulse apply operation of applying the additional verify voltage to the word line may be performed.

In an embodiment, the control logic 130 may include a program verify table storage 131 and a program verify controller 132.

The program verify table storage 131 may store reference counts respectively corresponding to the plurality of program states. Each of the reference counts may be the maximum number of verify loops to be performed in the program verify operation for a corresponding program state (e.g., a target program state) of the plurality of program states.

The program verify controller 132 may determine whether the program operation is failed, based on the result of the program verify operations respectively corresponding to the plurality of program states. When all of the program verify operations respectively corresponding to the plurality of program states are passed, the program verify controller 132 may determine that the program operation is passed. When at least one of the program verify operations respectively corresponding to the plurality of program states is failed, the program verify controller 132 may determine that the program operation is failed.

The program verify controller 132 may receive the reference count corresponding to the target program state from the program verify table storage 131.

When the target verify loop count is less than or equal to the reference count corresponding to the target program state, the program verify controller 132 may control the peripheral circuit 120 to perform the verify pulse apply operation in the verify loop. The target verify loop count may be the number of verify loops performed in the program verify operation corresponding to the target program state. When the target verify loop count is greater than the reference count corresponding to the target program state, the program verify controller 132 may control the peripheral circuit 120 to perform the verify pulse apply operation and the additional verify pulse apply operation in the verify loop.

In an embodiment, the verify voltage applied in the additional verify pulse apply operation may be higher than the verify voltage applied in the verify pulse apply operation. For example, the verify voltage applied in the verify pulse apply operation may be the minimum voltage of the threshold voltage distribution corresponding to the target program state. The verify voltage applied in the additional verify pulse apply operation may be the maximum voltage of the threshold voltage distribution corresponding to the target program state.

The program verify controller 132 may obtain the result of the verify pulse apply operation and the result of the additional verify pulse apply operation through the sensing circuit 125. The program verify controller 132 may determine whether the program verify operation corresponding to the target program state is failed, based on the results of the verify pulse apply operation and the additional verify pulse apply operation. When the verify pulse apply operation or the additional verify pulse apply operation is failed, the program verify controller 132 may determine that the program verify operation corresponding to the target program state is failed. When both of the verify pulse apply operation and the additional verify pulse apply operation are passed, the program verify controller 132 may determine that the program verify operation corresponding to the target program state is passed.

The program verify controller 132 may determine whether the verify pulse apply operation is failed, based on the result of comparing the number of memory cells having the threshold voltage lower than the verify voltage applied in the verify pulse apply operation among the memory cells programmed to the target program state with the reference permission bit number. The reference permission bit number may be the maximum bit number at which error correction is possible.

When the number of memory cells having the threshold voltage lower than the verify voltage applied in the verify pulse apply operation is greater than the reference permission bit number, the program verify controller 132 may determine that the verify pulse apply operation is failed. When the number of memory cells having the threshold voltage lower than the verify voltage applied in the verify pulse apply operation is less than or equal to the reference permission bit number, the program verify controller 132 may determine that the verify pulse apply operation is passed.

The result of the verify pulse apply operation may include a left margin check result of the threshold voltage distribution corresponding to the target program state. For example, it may be determined that a left margin of the threshold voltage distribution is larger as the number of memory cells having the threshold voltage lower than the verify voltage applied in the verify pulse apply operation decreases. Conversely, it may be determined that the left margin of the threshold voltage distribution is smaller as the number of memory cells having the threshold voltage lower than the verify voltage applied in the verify pulse apply operation increases.

The program verify controller 132 may determine whether the additional verify pulse apply operation is failed, based on the result of comparing the number of memory cells having the threshold voltage higher than the verify voltage applied in the additional verify pulse apply operation among the memory cells programmed to the target program state with the reference permission bit number.

When the number of memory cells having the threshold voltage higher than the verify voltage applied in the additional verify pulse apply operation is greater than the reference permission bit number, the program verify controller 132 may determine that the additional verify pulse apply operation is failed. When the number of memory cells having the threshold voltage higher than the verify voltage applied in the additional verify pulse apply operation is less than or equal to the reference permission bit number, the program verify controller 132 may determine that the additional verify pulse apply operation is passed.

The result of the additional verify pulse apply operation may include a right margin check result of the threshold voltage distribution corresponding to the target program state. For example, it may be determined that a right margin of the threshold voltage distribution is larger as the number of memory cells having the threshold voltage higher than the verify voltage applied in the additional verify pulse apply operation decreases. Conversely, it may be determined that the right margin of the threshold voltage distribution is smaller as the number of memory cells having the threshold voltage higher than the verify voltage applied in the additional verify pulse apply operation increases.

Figure 3:
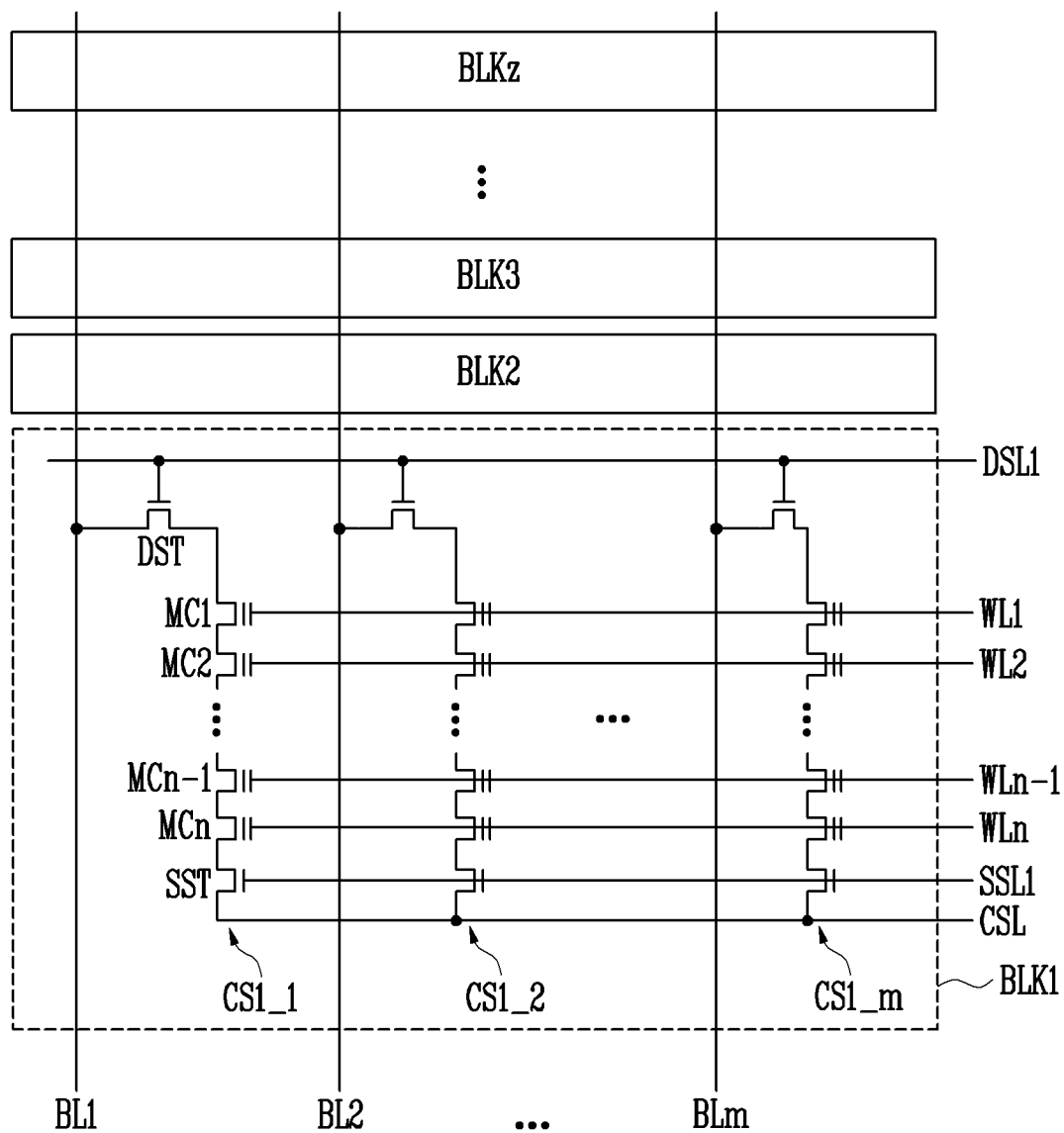
FIG. 3 is a diagram illustrating a memory cell array of FIG. 2, according to an embodiment of the present disclosure.

FIG. 3 is a diagram illustrating the memory cell array of FIG. 2, according to an embodiment of the present disclosure.

Referring to FIG. 3, first to z-th memory blocks BLK1 to BLKz are commonly connected to the first to m-th bit lines BL1 to BLm. In FIG. 3, for convenience of description, elements included in the first memory block BLK1 among the plurality of memory blocks BLK1 to BLKz are shown, and elements included in each of the remaining memory blocks BLK2 to BLKz are omitted. It may be understood that each of the remaining memory blocks BLK2 to BLKz is configured similarly to the first memory block BLK1.

The memory block BLK1 may include a plurality of cell strings CS1_1 to CS1_m (m is a positive integer). The first to m-th cell strings CS1_1 to CS1_m are connected to the first to m-th bit lines BL1 to BLm, respectively. Each of the first to m-th cell strings CS1_1 to CS1_m includes a drain select transistor DST, a plurality of memory cells MC1 to MCn (n is a positive integer) connected in series, and a source select transistor SST.

A gate terminal of the drain select transistor DST included in each of the first to m-th cell strings CS1_1 to CS1_m is connected to a drain select line DSL1. Each of the gate terminals of the first to n-th memory cells MC1 to MCn included in each of the first to m-th cell strings CS1_1 to CS1_m are connected to the first to n-th word lines WL1 to WLn. A gate terminal of the source select transistor SST included in each of the first to m-th cell strings CS1_1 to CS1_m is connected to a source select line SSL1.

For convenience of description, a structure of the cell string is described based on the first cell string CS1_1 among the plurality of cell strings CS1_1 to CS1_m. However, it may be understood that each of the remaining cell strings CS1_2 to CS1_m is configured similarly to the first cell string CS1_1.

A drain terminal of the drain select transistor DST included in the first cell string CS1_1 is connected to the first bit line BL1. A source terminal of the drain select transistor DST included in the first cell string CS1_1 is connected to a drain terminal of the first memory cell MC1 included in the first cell string CS1_1. The first to n-th memory cells MC1 to MCn are connected to each other in series. A drain terminal of the source select transistor SST included in the first cell string CS1_1 is connected to a source terminal of the n-th memory cell MCn included in the first cell string CS1_1. A source terminal of the source select transistor SST included in the first cell string CS1_1 is connected to a common source line CSL. In an embodiment, the common source line CSL may be commonly connected to the first to z-th memory blocks BLK1 to BLKz.

The drain select line DSL1, the first to n-th word lines WL1 to WLn, and the source select line SSL1 are included in the row lines RL of FIG. 2. The drain select line DSL1, the first to n-th word lines WL1 to WLn, and the source select line SSL1 are controlled by the address decoder 121. The common source line CSL is controlled by the control logic 130. The first to m-th bit lines BL1 to BLm are controlled by the read and write circuit 123.

Figure 4:
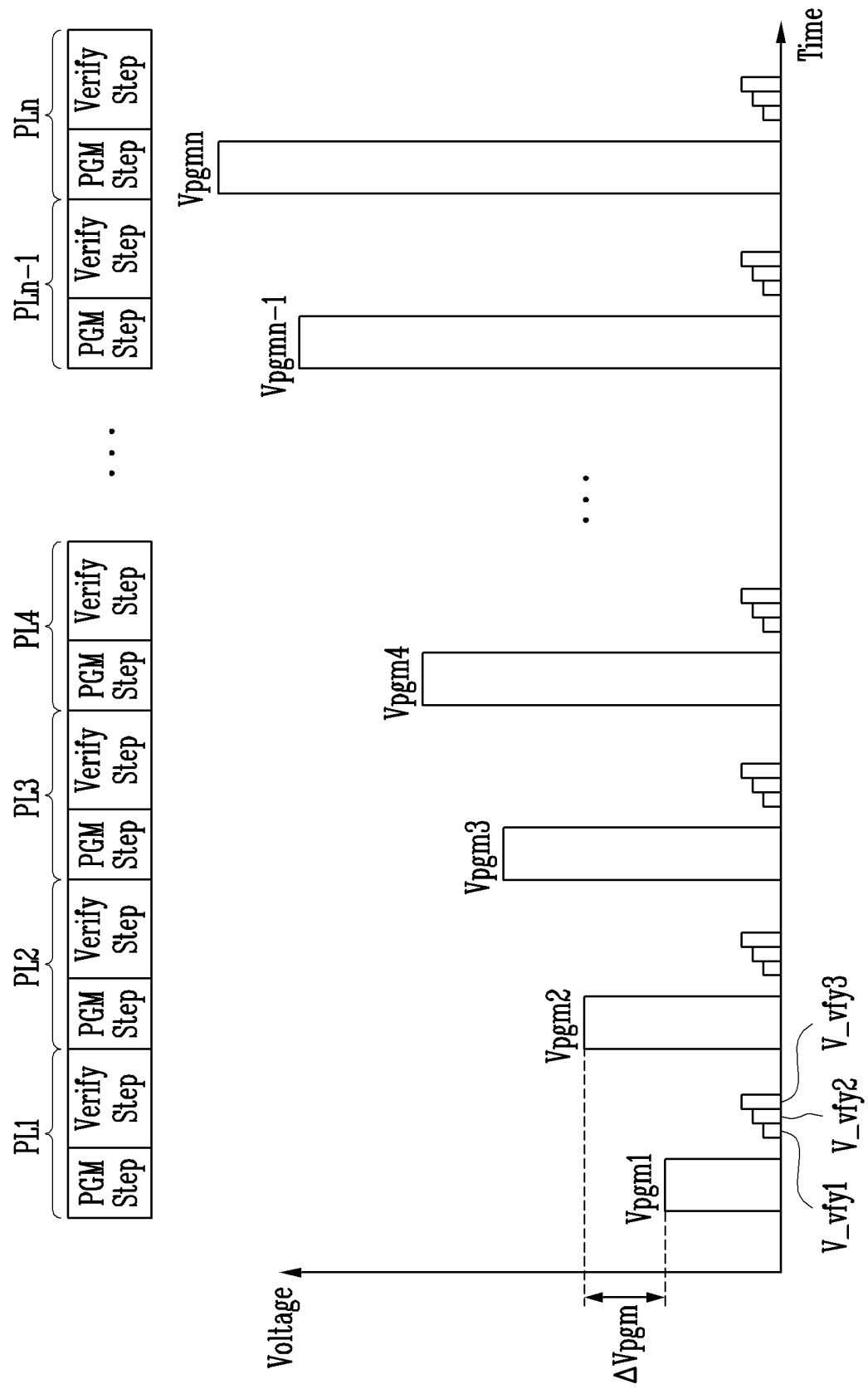
FIG. 4 is a diagram illustrating a program operation according to an embodiment of the present disclosure.

FIG. 4 is a diagram illustrating a program operation according to an embodiment of the present disclosure.

In FIG. 4, for convenience of description, the memory cell is a multi-level cell (MLC) storing 2-bit of data. However, the scope of the present disclosure is not limited thereto, and the memory cell may be a triple level cell (TLC) storing 3-bit of data or a quad level cell (QLC) storing 4-bit of data. The number of data bits stored in the memory cell may be one or more.

The memory device may perform a plurality of program loops PL1 to PLn to program selected memory cells to have a threshold voltage corresponding to any of a plurality of program states P1, P2, and P3.

Each of the plurality of program loops PL1 to PLn may include a program voltage apply step PGM Step of applying the program voltage to the selected word line connected to the selected memory cells and a program verify step Verify Step of determining whether the memory cells are programmed by applying the verify voltages.

For example, when the first program loop PL1 is performed, first to third verify voltages V_vfy1 to V_vfy3 are sequentially applied to verify the program state of the selected memory cells after a first program voltage Vpgm1 is applied. At this time, verification of the memory cells of which the target program state is the first program state P1 may be performed by the first verify voltage V_vfy1, verification of the memory cells of which the target program state is the second program state P2 may be performed by the second verify voltage V_vfy2, and verification of the memory cells of which the target program state is the third program state P3 may be performed by the third verify voltage V_vfy3.

The memory cells of which the verification is passed by the verify voltages V_vfy1 to V_vfy3 may be determined to have the target program state, and then program of the memory cells of which the verification is passed by the verify voltages V_vfy1 to V_vfy3 may be inhibited in the second program loop PL2. In other words, a program prohibition voltage may be applied to a bit line connected to the memory cell of which the verification is passed from the second program loop PL2.

In the second program loop PL2, a second program voltage Vpgm2 higher than the first program voltage Vpgm1 by a unit voltage ΔVpgm is applied to the selected word line in order to program the remaining memory cells other than the memory cells of which the program is inhibited. Thereafter, the verify operation is performed in the same method as the verify operation of the first program loop PL1. The verify pass indicates that the memory cell is read as an off-cell by a corresponding verify voltage.

As described above, when the memory device programs the MLC storing 2-bits, the memory device verifies each of the memory cells of which each program state becomes the target program state using the first to third verify voltages V_vfy1 to V_vfy3.

During the verify operation, the verify voltage is applied to the selected word line, which is the word line to which the selected memory cells are connected, and the page buffer of FIG. 2 may determine whether the verification of the memory cells is passed, based on a current flowing through the bit lines respectively connected to the selected memory cells or a voltage applied to the bit line.

In an embodiment, the program verify step Verify Step may be referred to as the verify loop described with reference to FIGS. 1 and 2.

Figure 5:
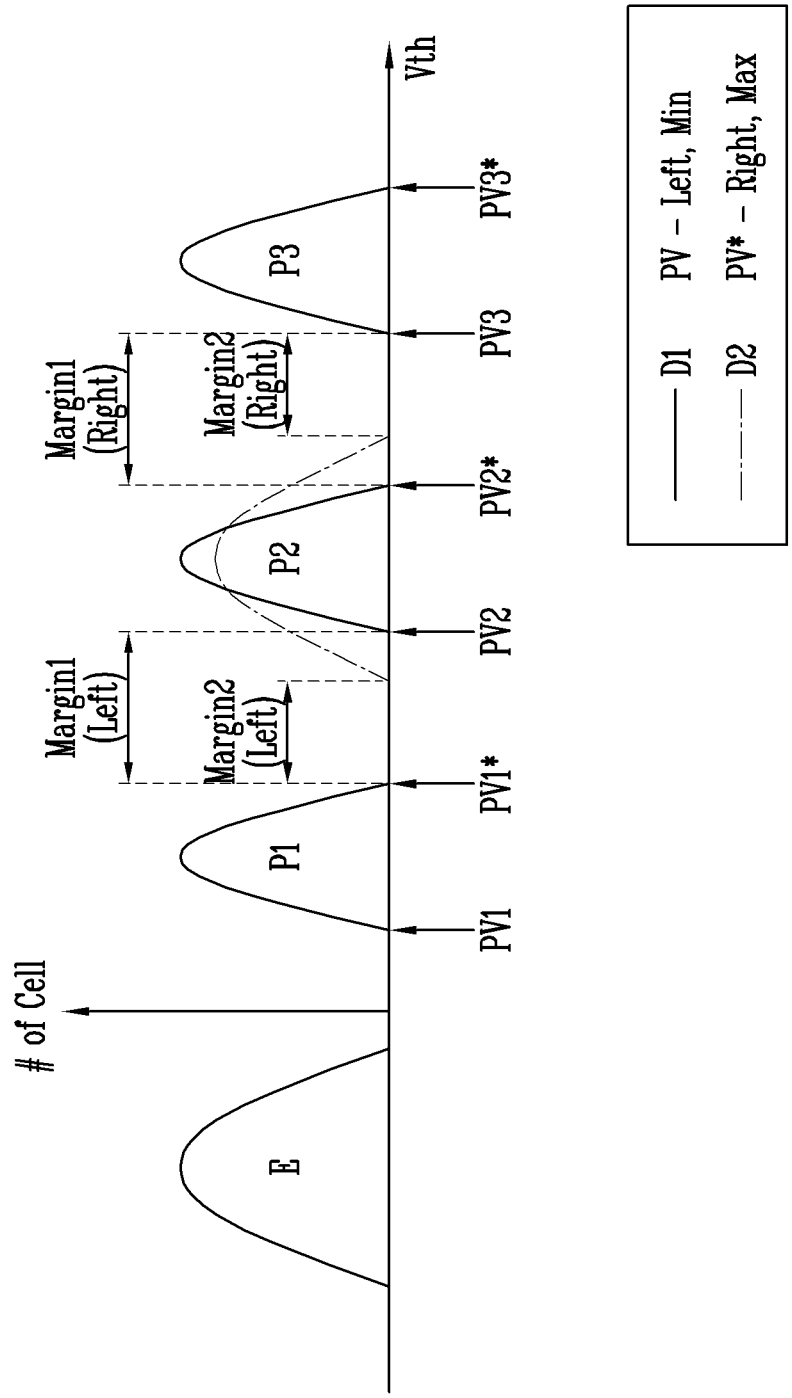
FIG. 5 is a diagram illustrating a threshold voltage distribution of a memory cell according to an embodiment of the present disclosure.

FIG. 5 is a diagram illustrating a threshold voltage distribution of a memory cell according to an embodiment of the present disclosure.

In FIG. 5, the memory cell is an MLC storing 2-bit data. The number of data bits stored in the memory cell is not limited to the present embodiment.

The memory cell may be programmed to any of the erase state E and the first to third program states P1 to P3. FIG. 5 shows a first threshold voltage distribution D1 corresponding to each of the erase state E and the first to third program states P1 to P3. For convenience of description, a second threshold voltage distribution D2 shows only a threshold voltage distribution corresponding to the second program state P2.

In an embodiment, a minimum voltage PV and a maximum voltage PV* of the threshold voltage distribution corresponding to each program state may be used as the verify voltage of the program verify operation.

For example, in the program verify operation corresponding to the second program state P2, the verify voltage PV2 may be the verify voltage applied in the verify pulse apply operation. The verify voltage PV2* may be the verify voltage applied in the additional verify pulse apply operation.

The result of the verify pulse apply operation to which the verify voltage PV2 is applied may include a left margin check result for the second program state P2. For example, it may be determined that a left margin is smaller as the number of memory cells having a threshold voltage lower than the verify voltage PV2 among memory cells programmed to the second program state P2 increases. It may be determined that the left margin is larger as the number of memory cells having the threshold voltage lower than the verify voltage PV2 among the memory cells programmed to the second program state P2 decreases.

The result of the additional verify pulse apply operation to which the verify voltage PV2* is applied may include a right margin check result for the second program state P2. For example, it may be determined that a right margin is smaller as the number of memory cells having a threshold voltage higher than the verify voltage PV2* among the memory cells programmed to the second program state P2 increases. It may be determined that the right margin is larger as the number of memory cells having the threshold voltage higher than the verify voltage PV2* among the memory cells programmed to the second program state P2 decreases.

In FIG. 5, when comparing the first threshold voltage distribution D1 and the second threshold voltage distribution D2 corresponding to the second program state P2, both of the left margin and the right margin of the first threshold voltage distribution D1 are larger than those of the second threshold voltage distribution D2.

Figures 6, 7:
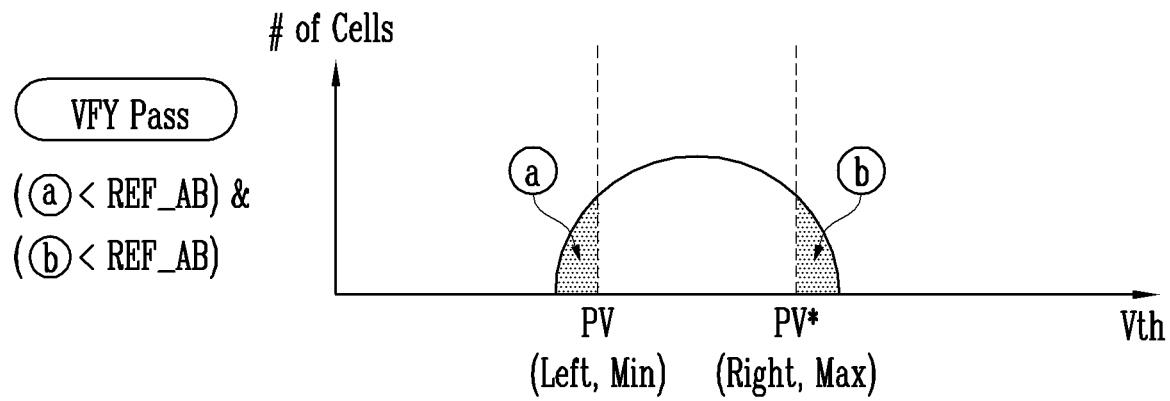
FIG. 6 is a diagram illustrating pass and fail of a program verify operation according to an embodiment of the present disclosure.
FIG. 7 is a diagram illustrating a program verify table storage of FIG. 1, according to an embodiment of the present disclosure.

FIG. 6 is a diagram illustrating pass and fail of a program verify operation according to an embodiment of the present disclosure.

Referring to FIG. 6, in the program verify operation corresponding to the target program state, the verify pulse apply operation using the verify voltage PV and the additional verify pulse apply operation using the verify voltage PV* may be performed. The verify voltage PV* applied in the additional verify pulse apply operation may be higher than the verify voltage PV applied in the verify pulse apply operation.

In an embodiment, the verify voltage PV may be the minimum voltage of the reference threshold voltage distribution corresponding to the target program state. The verify voltage PV* may be the maximum voltage of the reference threshold voltage distribution corresponding to the target program state. However, levels of the verify voltage PV* and the verify voltage PV are not limited to the present embodiment.

The pass or fail of the program verify operation VFY may be determined based on the result of the verify pulse apply operation and the result of the additional verify pulse apply operation. For example, when both of the verify pulse apply operation and the additional verify pulse apply operation are passed, the program verify operation VFY is passed. When the verify pulse apply operation or the additional verify pulse apply operation is failed, the program verify operation VFY is failed.

In FIG. 6, when the number ⓐ of memory cells having the threshold voltage lower than the verify voltage PV is less than a reference permission bit number REF_AB, the verify pulse apply operation may be passed. When the number ⓑ of memory cells having the threshold voltage higher than the verify voltage PV* is less than the reference permission bit number REF_AB, the additional verify pulse apply operation may be passed. In this case, since both of the verify pulse apply operation and the additional verify pulse apply operation are the pass, the program verify operation VFY may be the pass.

When the number ⓒ of memory cells having the threshold voltage higher than the verify voltage PV* is greater than the reference permission bit number REF_AB, the additional verify pulse apply operation may be the fail. In this case, since the additional verify pulse apply operation is the fail, the program verify operation VFY may be the fail.

FIG. 7 is a diagram illustrating the program verify table storage of FIG. 2, according to an embodiment of the present disclosure.

Referring to FIG. 7, when the memory cell is a TLC storing 3-bit data, the memory cell may be programmed to any of the first to seventh program states P1 to P7. The number of data bits stored in the memory cell and the number of program states to which the memory cell may be programmed are not limited to the present embodiment.

The program verify table storage may store reference counts respectively corresponding to the plurality of program states to which the memory cell is to be programmed. Each of the reference counts may be the maximum number of the verify loops to be performed in the program verify operation for a corresponding program state (e.g., a target program state) of the plurality of program states.

In FIG. 7, the program verify table storage may store reference counts corresponding to the respective first to seventh program states P1 to P7. The reference count PV1_LM corresponding to the first program state P1 may be the maximum number of the verify loops to be performed in the program verify operation corresponding to the first program state P1. The reference count PV2_LM corresponding to the second program state P2 may be the maximum number of the verify loops to be performed in the program verify operation corresponding to the second program state P2. In the same method, the reference count PV7_LM corresponding to the seventh program state P7 may be the maximum number of the verify loops to be performed in the program verify operation corresponding to the seventh program state P7.

Figure 8:
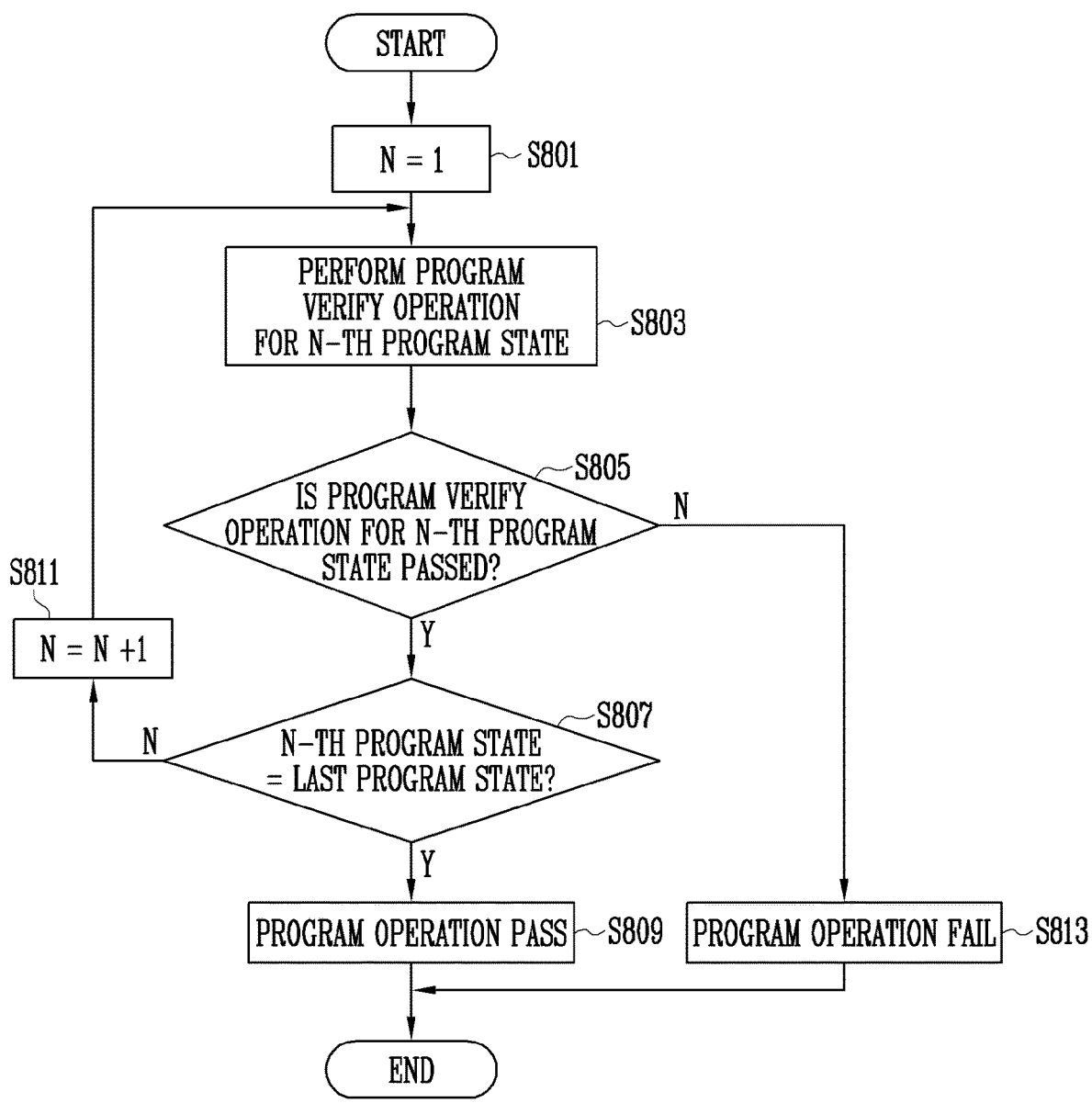
FIG. 8 is a flowchart illustrating pass/fail of a program operation according to an embodiment of the present disclosure.

FIG. 8 is a flowchart illustrating pass/fail of a program operation according to an embodiment of the present disclosure.

Referring to FIG. 8, in operation S801, N may be set as 1.

In operation S803, a program verify operation for an N-th program state may be performed.

In operation S805, it may be determined whether the program verify operation for the N-th program state is passed. When the program verify operation is passed, the operation proceeds to operation S807, and when the program verify operation is failed, the operation proceeds to operation S813.

In operation S807, it may be determined whether the N-th program state is a last program state. When the N-th program state is the last program state, the operation proceeds to operation S809, and when the N-th program state is not the last program state, the operation proceeds to operation S811. The last program state may be the highest program state among the plurality of program states to which the memory cells are to be programmed.

In operation S809, the program operation may be determined as pass.

In operation S811, N may increase by 1.

In operation S813, the program operation may be determined as fail.

In FIG. 8, as described, the pass or fail of the program operation may be determined based on the result of the program verify operation corresponding to each of the plurality of program states. When all of the program verify operations respectively corresponding to the plurality of program states are passed, the program operation may be pass. When at least one of the program verify operations respectively corresponding to the plurality of program states is failed, the program operation may be fail.

Figure 9:
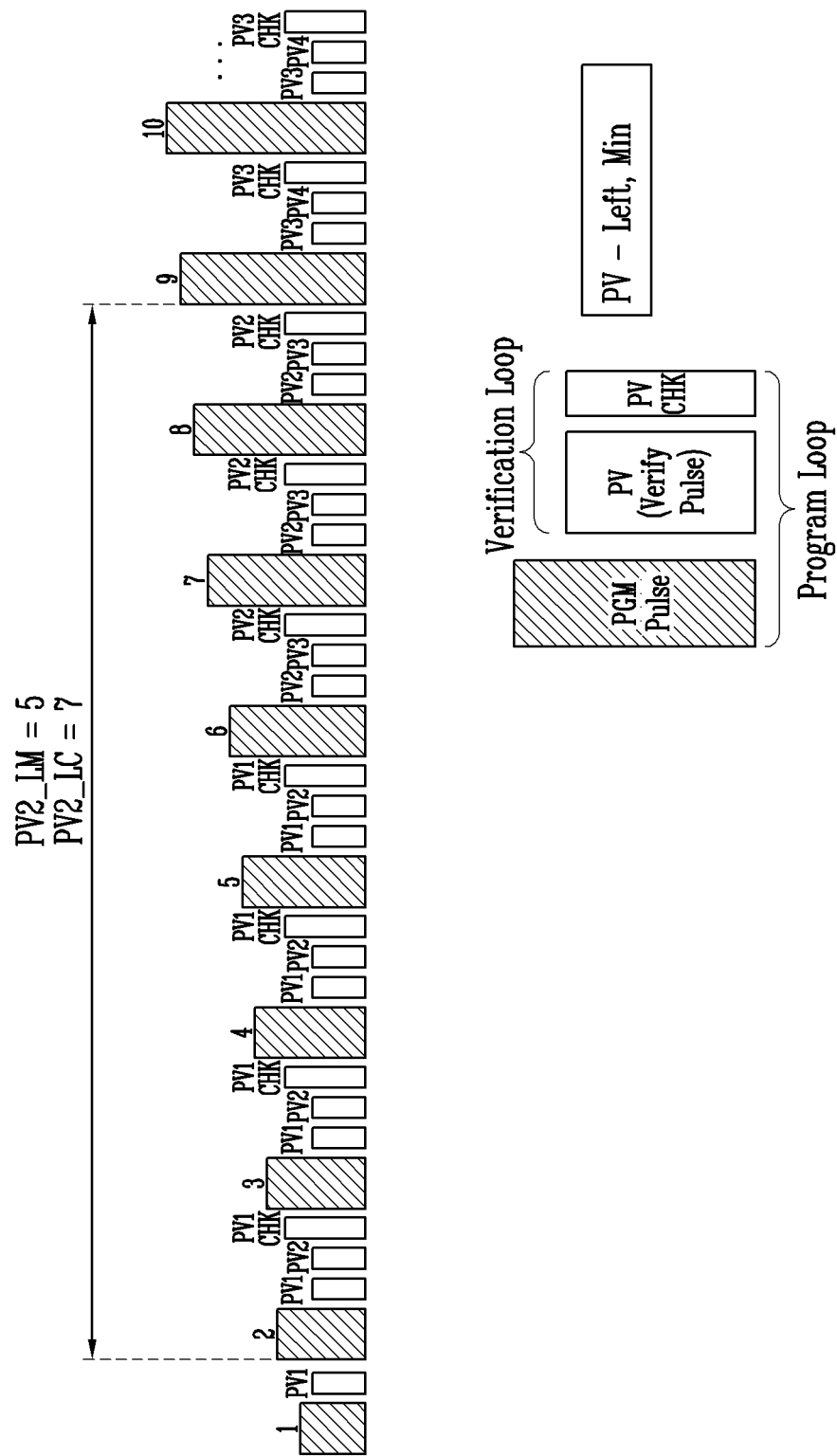
FIG. 9 is a diagram illustrating a verify loop according to an embodiment of the present disclosure.

FIG. 9 is a diagram illustrating a verify loop according to an embodiment of the present disclosure.

Referring to FIG. 9, the program loop may include a program pulse apply loop and a verify loop. In a case of FIG. 9, the verify pulse apply operation of applying the verify voltage PV corresponding to the target program state may be performed in the verify loop. After the verify pulse apply operation is performed in the verify loop, a verify check operation may be performed. When the verify check operation is passed, the verify pulse apply operation for the target program state may be completed.

In FIG. 9, the reference count PV2_LM corresponding to the second program state may be 5. The reference count PV2_LM corresponding to the second program state is not limited to the present embodiment.

The verify loop count PV2_LC, which is the number of verify loops performed in the program verify operation corresponding to the second program state, may be 7.

In the embodiment of FIG. 9, since the verify loop count PV2_LC exceeds the reference count PV2_LM, the program verify operation corresponding to the second program state may be fail. Since the program verify operation corresponding to the second program state is the fail, the program operation on the memory cell may be fail.

Figure 10:
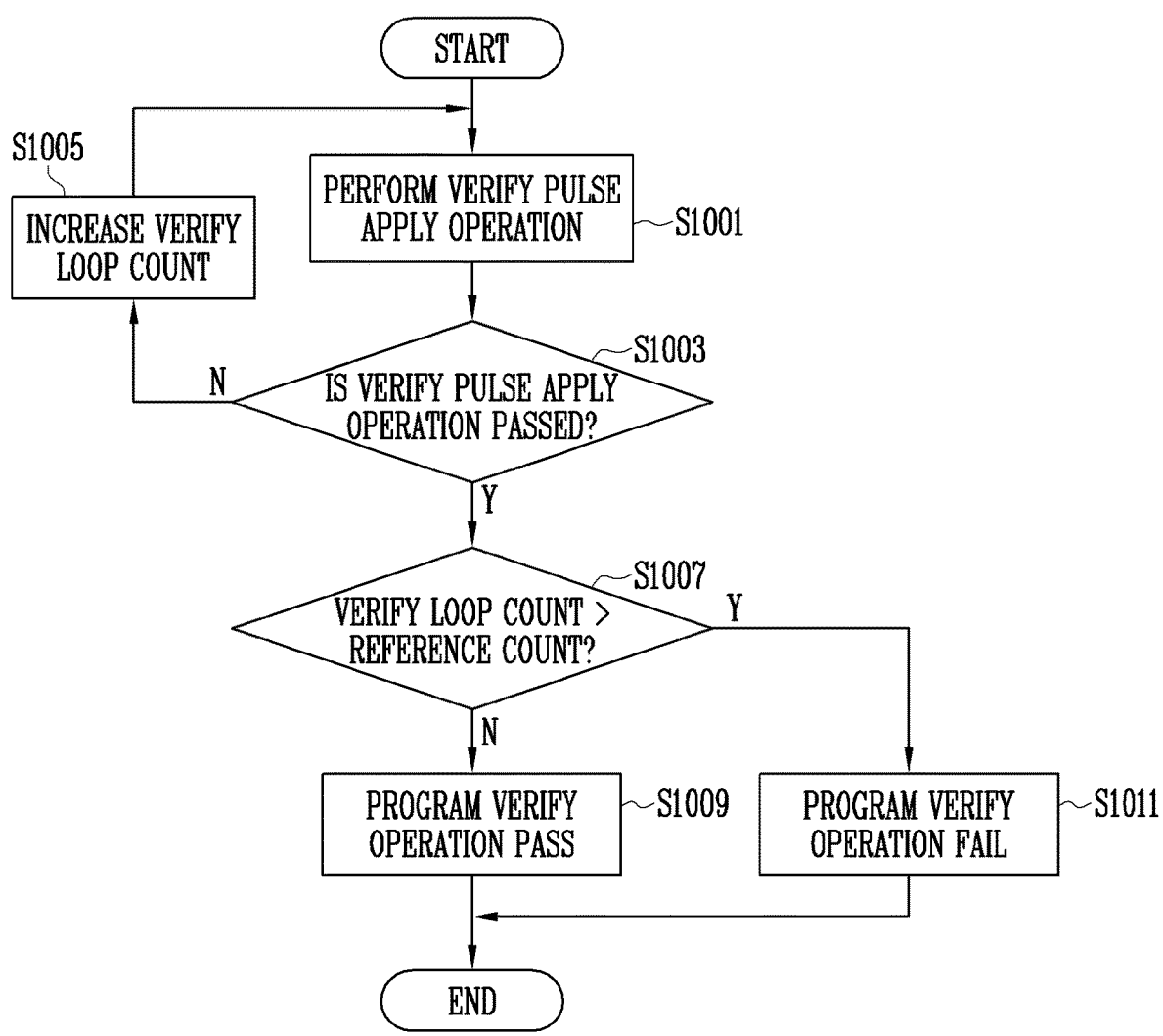
FIG. 10 is a flowchart illustrating a program verify operation of FIG. 9, according to an embodiment of the present disclosure.

FIG. 10 is a flowchart illustrating the program verify operation of FIG. 9, according to an embodiment of the present disclosure.

Referring to FIG. 10, in operation S1001, the verify pulse apply operation corresponding to the target program state may be performed.

In operation S1003, it may be determined whether the verify pulse apply operation is pass. As a result of the determination, when the verify pulse apply operation is the pass, the operation proceeds to operation S1007, and when the verify pulse apply operation is fail, the operation proceeds to operation S1005.

In operation S1005, the verify loop count may increase.

In operation S1007, it may be determined whether the verify loop count exceeds the reference count. When the verify loop count is greater than the reference count, the operation proceeds to operation S1011, and when the verify loop count is less than or equal to the reference count, the operation proceeds to operation S1009.

In operation S1009, the program verify operation may be determined as pass.

In operation S1011, the program verify operation may be determined as fail.

Referring to FIGS. 9 and 10, even though the verify pulse apply operation corresponding to the second program state is passed, the program verify operation is determined as the fail when the verify loop count, which is performed until the verify pulse apply operation is passed, exceeds the reference count.

Figure 11:
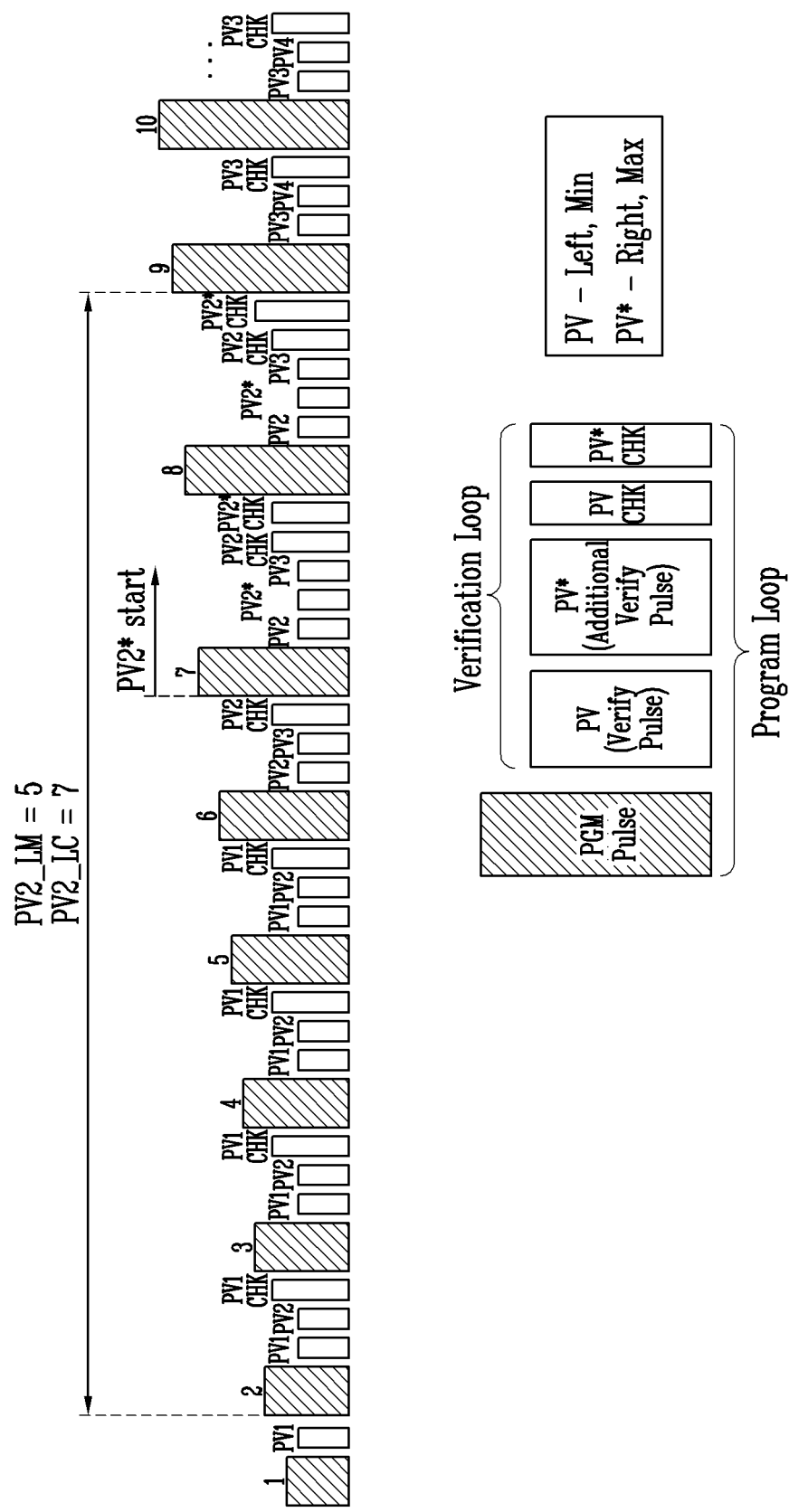
FIG. 11 is a diagram illustrating a verify loop according to an embodiment of the present disclosure.

FIG. 11 is a diagram illustrating a verify loop according to an embodiment of the present disclosure.

Referring to FIG. 11, the verify pulse apply operation of applying the verify voltage PV and the additional verify pulse apply operation of applying the verify voltage PV* may be performed in the verify loop.

In FIG. 11, the reference count PV2_LM corresponding to the second program state may be 5. The reference count PV2_LM corresponding to the second program state is not limited to the present embodiment.

The verify loop count PV2_LC, which is the number of verify loops performed in the program verify operation corresponding to the second program state, may be 7.

In the embodiment of FIG. 11, when the verify loop count PV2_LC is less than or equal to the reference count PV2_LM, the verify pulse apply operation may be performed in the verify loop. When the verify loop count PV2_LC is greater than the reference count PV2_LM, the verify pulse apply operation and the additional verify pulse apply operation may be performed in the verify loop.

In the embodiment of FIG. 11, even though the verify loop count PV2_LC exceeds the reference count PV2_LM, the program verify operation corresponding to the second program state may be determined as pass when both of the verify pulse apply operation and the additional verify pulse apply operation are passed, as described with reference to FIG. 6.

Figure 12:
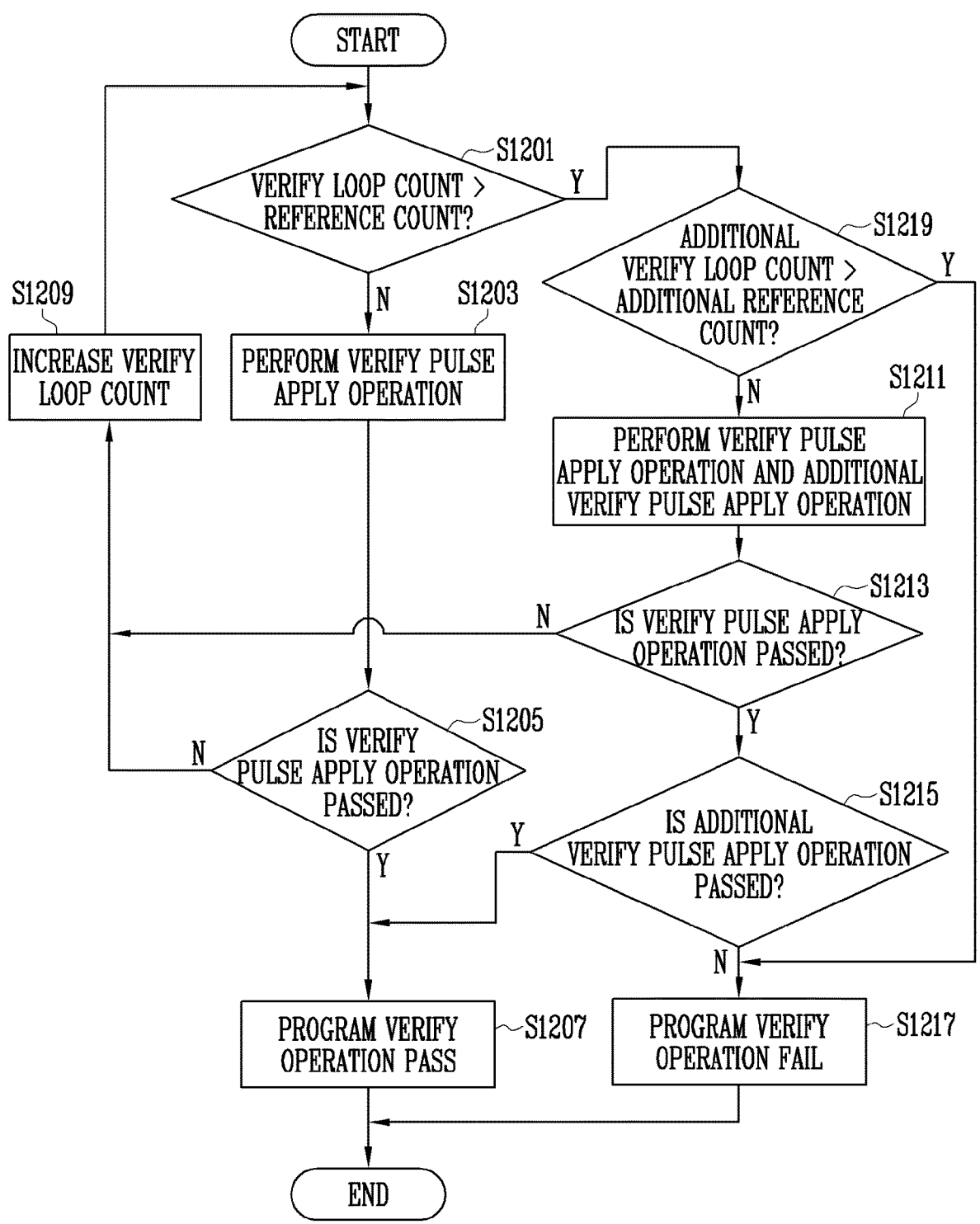
FIG. 12 is a flowchart illustrating a program verify operation of FIG. 11, according to an embodiment of the present disclosure.

FIG. 12 is a flowchart illustrating the program verify operation of FIG. 11, according to an embodiment of the present disclosure.

Referring to FIG. 12, in operation S1201, it may be determined whether the verify loop count, which is the number of verify loops performed in the program verify operation corresponding to the target program state, is greater than the reference count. When the verify loop count is greater than the reference count, the operation proceeds to operation S1219, and when the verify loop count is less than or equal to the reference count, the operation proceeds to operation S1203.

In operation S1203, the verify pulse apply operation may be performed.

In operation S1205, it may be determined whether the verify pulse apply operation is pass. As a result of the determination, when the verify pulse apply operation is the pass, the operation proceeds to operation S1207, and when the verify pulse apply operation is fail, the operation proceeds to operation S1209.

In operation S1207, the program verify operation may be determined as pass.

In operation S1209, the verify loop count may increase.

In operation S1211, the verify pulse apply operation and the additional verify pulse apply operation may be performed.

In operation S1213, it may be determined whether the verify pulse apply operation is the pass. As a result of the determination, when the verify pulse apply operation is the pass, the operation proceeds to operation S1215, and when the verify pulse apply operation is fail, the operation proceeds to operation S1209.

In operation S1215, it may be determined whether the additional verify pulse apply operation is pass. As a result of the determination, when the additional verify pulse apply operation is the pass, the operation proceeds to operation S1207, and when the verify pulse apply operation is fail, the operation proceeds to operation S1217.

In operation S1217, the program verify operation may be determined as fail.

In operation S1219, it may be determined whether an additional verify loop count, which is the number of verify loops, including the additional verify pulse apply operation, performed in the program verify operation corresponding to the target program state, is greater than an additional reference count. When the additional verify loop count is greater than the additional reference count, the operation proceeds to operation S1217, and when the additional verify loop count is less than or equal to the additional reference count, the operation proceeds to operation S1211. The additional reference count may be the maximum number of the verify loops including the additional verify pulse apply operation to be performed in the program verify operation.

Referring to FIGS. 11 and 12, even though the verify loop count, which is performed until the verify pulse apply operation corresponding to the second program state is passed, exceeds the reference count, the program verify operation may be determined as the pass when both of the verify pulse apply operation and the additional verify pulse apply operation are passed.

In a case of the embodiment of FIG. 10, when the verify loop count exceeds the reference count, the program verify operation is determined as the fail. In a case of the embodiment of FIG. 12, even though the verify loop count exceeds the reference count, the program verify operation is determined as the pass when both of the verify pulse apply operation and the additional verify pulse apply operation are passed.

A slow memory cell may be programmed slower than a normal memory cell. That is, since the slow memory cell is programmed slower than the normal memory cell, more verify loops may be performed. Even in the slow memory cell, when both of the verify pulse apply operation and the additional verify pulse apply operation are passed, it may be determined that the slow memory cell is normally programmed.

In the case of the embodiment of FIG. 10, due to a tight reference count or the slow memory cell, even a normally programmed memory cell may be determined as a program operation fail. Therefore, unnecessary overkill may occur and yield may be reduced.

In the case of the embodiment of FIG. 12, even though the verify loop count exceeds the reference count, it is determined as a program operation pass when the program is normally performed. Therefore, unnecessary overkill may be prevented and yield may be improved.

Although the detailed description of the present disclosure describes specific embodiments, various changes are possible without departing from the scope and technical spirit of the present disclosure. Therefore, the scope of the present disclosure should not be limited to the above-described embodiments, and should be determined by the equivalents of the claims of the present disclosure as well as the following claims.

What is claimed is:

1. A memory device comprising:
   a plurality of memory cells;
   a peripheral circuit configured to perform a program operation on the plurality of memory cells and perform program verify operations each including at least one verify loop corresponding to a plurality of program states programmed in the program operation; and
   a control logic configured to control the peripheral circuit to perform a verify pulse apply operation and an additional verify pulse apply operation when a target verify loop count, which is a number of verify loops performed in the program verify operation corresponding to a target program state among the plurality of program states, exceeds a reference count corresponding to the target program state, and determine whether the program verify operation corresponding to the target program state is failed based on results of the verify pulse apply operation and the additional verify pulse apply operation,
   wherein a verify voltage higher than a verify voltage of the verify pulse apply operation is applied to the memory cells in the additional verify pulse apply operation.

2. The memory device of claim 1, wherein the control logic comprises:
   a program verify table storage configured to store reference counts respectively corresponding to the plurality of program states; and
   a program verify controller configured to control the peripheral circuit to perform the verify pulse apply operation or perform both of the verify pulse apply operation and the additional verify pulse apply operation, based on a result of comparing the target verify loop count and the reference count corresponding to the target program state.

3. The memory device of claim 2, wherein the program verify controller controls the peripheral circuit to perform the verify pulse apply operation in each of the at least one verify loop when the target verify loop count is less than or equal to the reference count corresponding to the target program state.

4. The memory device of claim 2, wherein the program verify controller controls the peripheral circuit to perform both of the verify pulse apply operation and the additional verify pulse apply operation in each of the at least one verify loop when the target verify loop count is greater than the reference count corresponding to the target program state.

5. The memory device of claim 2, wherein the program verify controller is further configured to determine that the program verify operation corresponding to the target program state is passed when both of the verify pulse apply operation and the additional verify pulse apply operation are passed.

6. The memory device of claim 2, wherein the program verify controller is further configured to determine that the program verify operation corresponding to the target program state is failed when the verify pulse apply operation or the additional verify pulse apply operation is failed.

7. The memory device of claim 2, wherein the program verify controller is further configured to determine whether the verify pulse apply operation is failed, based on a result of comparing a number of memory cells having a threshold voltage lower than the verify voltage applied in the verify pulse apply operation among memory cells programmed to the target program state with a reference permission bit number.

8. The memory device of claim 2, wherein the program verify controller is further configured to determine whether the additional verify pulse apply operation is failed, based on a result of comparing a number of memory cells having a threshold voltage higher than the verify voltage applied in the additional verify pulse apply operation among the memory cells programmed to the target program state with a reference permission bit number.

9. The memory device of claim 2, wherein the program verify controller is further configured to determine whether the program operation is failed, based on a result of the program verify operations respectively corresponding to the plurality of program states.

10. The memory device of claim 9, wherein the program verify controller determines that the program operation is passed when all program verify operations respectively corresponding to the plurality of program states are passed.

11. The memory device of claim 1, wherein the verify voltage applied in the verify pulse apply operation performed in the program verify operation corresponding to the target program state is a minimum voltage of a threshold voltage distribution corresponding to the target program state.

12. The memory device of claim 1, wherein the verify voltage applied in the additional verify pulse apply operation performed in the program verify operation corresponding to the target program state is a maximum voltage of a threshold voltage distribution corresponding to the target program state.

13. The memory device of claim 1, wherein a result of the verify pulse apply operation performed in the program verify operation corresponding to the target program state includes a left margin check result of a threshold voltage distribution corresponding to the target program state.

14. The memory device of claim 1, wherein a result of the additional verify pulse apply operation performed in the program verify operation corresponding to the target program state includes a right margin check result of a threshold voltage distribution corresponding to the target program state.

15. A method of operating a memory device, the method comprising:

performing a program operation on a plurality of memory cells; and
performing program verify operations each including at least one verify loop corresponding to a plurality of program states programmed in the program operation,
wherein performing a program verify operation corresponding to a target program state among the plurality of program states comprises:
performing a verify pulse apply operation; and
performing an additional verify pulse apply operation in which a verify voltage higher than a verify voltage of the verify pulse apply operation is applied to the memory cells, when a target verify loop count, which is a number of verify loops performed in the program verify operation corresponding to the target program state, exceeds a reference count corresponding to the target program state.

16. The method of claim 15, further comprising determining whether the program verify operation corresponding to the target program state is failed, based on results of the verify pulse apply operation and the additional verify pulse apply operation.

17. The method of claim 16, wherein the result of the verify pulse apply operation is determined based on a result of comparing a number of memory cells having a threshold voltage lower than the verify voltage applied in the verify pulse apply operation among memory cells programmed to the target program state with a reference permission bit number.

18. The method of claim 16, wherein the result of the additional verify pulse apply operation is determined based on a result of comparing a number of memory cells having a threshold voltage higher than the verify voltage applied in the additional verify pulse apply operation among memory cells programmed to the target program state with a reference permission bit number.

19. The method of claim 16,
wherein the performing the verify pulse apply operation in the program verify operation corresponding to the target program state comprises applying a minimum voltage of a threshold voltage distribution corresponding to the target program state as the verify voltage, and
wherein the performing the additional verify pulse apply operation in the program verify operation corresponding to the target program state comprises applying a maximum voltage of the threshold voltage distribution corresponding to the target program state as the verify voltage.

20. The method of claim 16, further comprising determining whether the program operation is failed, based on a result of the program verify operations respectively corresponding to the plurality of program states.

* * * * *